(12) United States Patent
Campardo et al.

(10) Patent No.: US 12,120,967 B2
(45) Date of Patent: Oct. 15, 2024

(54) PHASE-CHANGE MEMORY INCLUDING PHASE-CHANGE ELEMENTS IN SERIES WITH RESPECTIVE HEATER ELEMENTS AND METHODS FOR MANUFACTURING, PROGRAMMING, AND READING THEREOF

(71) Applicant: STMicroelectronics S.r.l., Agrate Brianza (IT)

(72) Inventors: Giovanni Campardo, Bergamo (IT); Massimo Borghi, Gerenzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 166 days.

(21) Appl. No.: 17/644,942

(22) Filed: Dec. 17, 2021

(65) Prior Publication Data

US 2022/0199900 A1    Jun. 23, 2022

(30) Foreign Application Priority Data

Dec. 23, 2020    (IT) .......................... 102020000032270

(51) Int. Cl.
*H10N 70/20*    (2023.01)
*G11C 13/00*    (2006.01)
(Continued)

(52) U.S. Cl.
CPC ....... *H10N 70/231* (2023.02); *G11C 13/0004* (2013.01); *G11C 13/004* (2013.01);
(Continued)

(58) Field of Classification Search
None
See application file for complete search history.

(56) References Cited

U.S. PATENT DOCUMENTS 10,147,876 B1 * 12/2018 Huang ................. H10N 70/235
2003/0185049 A1 * 10/2003 Fricke .................... G11C 5/025
365/170

(Continued)

OTHER PUBLICATIONS

Zuliani, Paola et al., "Overcoming Temperature Limitations in Phase Change Memories With Optimized GexSbyTez", IEEE Transactions on Electron Devices, vol. 60, Issue 12, Dec. 2013 (Nov. 1, 2013), 7 pages.

(Continued)

*Primary Examiner* — J. H. Hur
(74) *Attorney, Agent, or Firm* — Slater Matsil, LLP

(57) ABSTRACT

A phase-change memory (PCM) includes a semiconductor body housing a selection transistor; a electrical-insulation body disposed over the semiconductor body; a conductive region, extending through the electrical-insulation body, electrically coupled to the selection transistor; and a plurality of heater elements in the electrical-insulation body. Each of the plurality of heater elements include a first end in electrical contact with a respective portion of the conductive region and a second end that extends away from the conductive region. The PCM further includes a plurality of phase-change elements extending in the electrical-insulation body and including data storage regions, where each of the data storage regions being electrically and thermally coupled to one respective heater element at the second end of the respective heater element.

19 Claims, 9 Drawing Sheets

(51) Int. Cl.
*H01L 23/528* (2006.01)
*H10B 63/00* (2023.01)
*H10N 70/00* (2023.01)

(52) U.S. Cl.
CPC ...... *G11C 13/0069* (2013.01); *H01L 23/5286* (2013.01); *H10B 63/30* (2023.02); *H10N 70/021* (2023.02); *G11C 2013/0045* (2013.01); *G11C 2213/79* (2013.01)

(56) References Cited

U.S. PATENT DOCUMENTS

| | | | | |
|---|---|---|---|---|
| 2005/0158950 | A1* | 7/2005 | Scheuerlein | H10N 70/8413 438/257 |
| 2006/0157679 | A1* | 7/2006 | Scheuerlein | G11C 11/21 257/2 |
| 2007/0138595 | A1* | 6/2007 | Hsu | H10N 70/063 257/536 |
| 2007/0247898 | A1* | 10/2007 | Nirschl | G11C 13/0004 365/163 |
| 2008/0316798 | A1* | 12/2008 | Tanizaki | G11C 13/0069 365/210.1 |
| 2009/0154227 | A1* | 6/2009 | Philipp | G11C 13/003 438/102 |
| 2009/0261313 | A1 | 10/2009 | Lung et al. | |
| 2010/0259962 | A1 | 10/2010 | Yan et al. | |
| 2010/0270593 | A1 | 10/2010 | Lung et al. | |
| 2013/0170283 | A1 | 7/2013 | Lan et al. | |
| 2013/0242638 | A1* | 9/2013 | Takashima | G11C 11/1659 365/148 |
| 2014/0061574 | A1* | 3/2014 | Pio | H10B 63/24 257/E45.001 |
| 2019/0115391 | A1* | 4/2019 | Nardi | G11C 13/004 |
| 2019/0198569 | A1* | 6/2019 | Hsu | G11C 13/0004 |

OTHER PUBLICATIONS

European Patent Office, Communication pursuant to Article 94(3) EPC, issued in Application No. 21217194.6-1211, May 8, 2024, 6 pages.

* cited by examiner

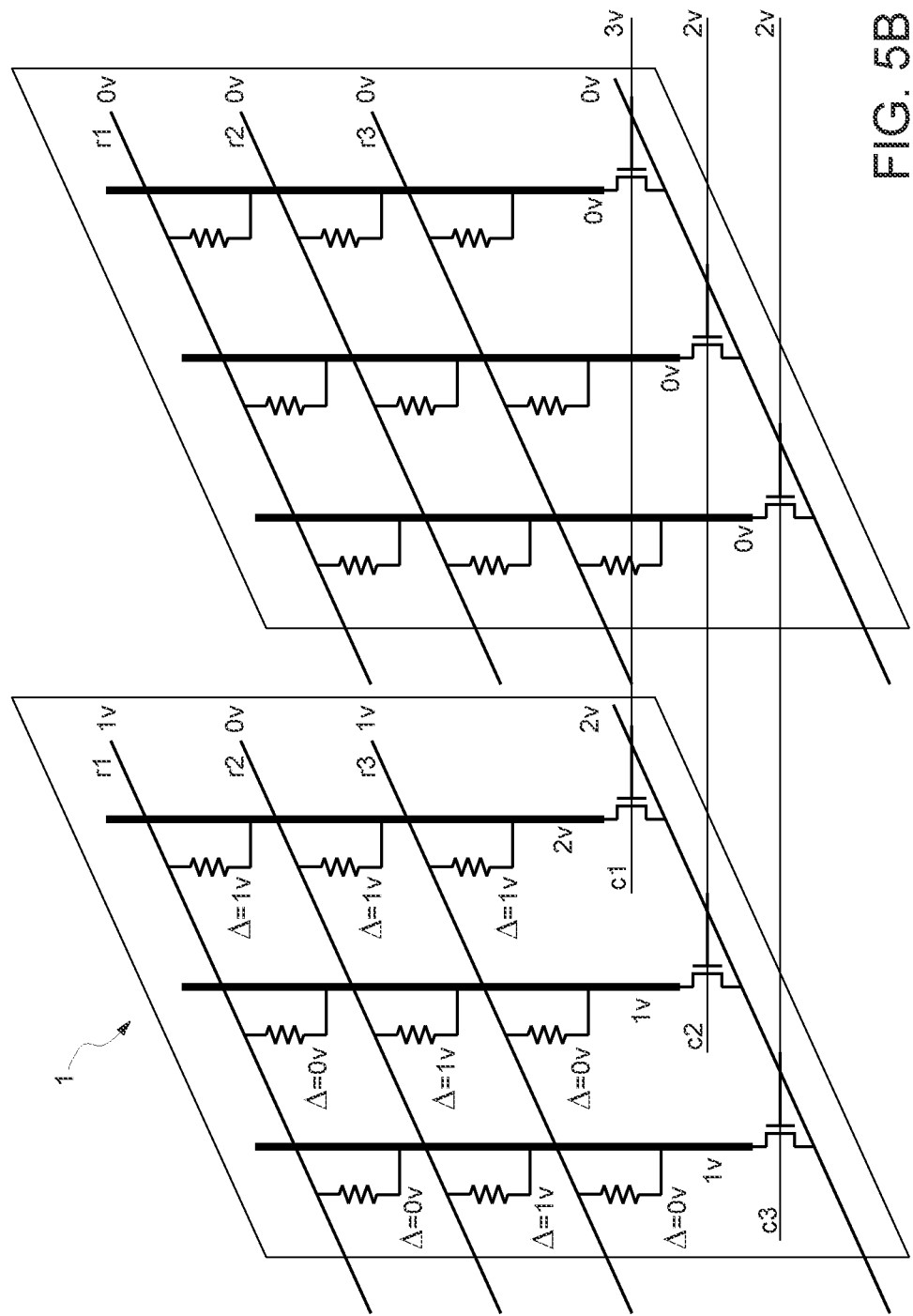

PHASE-CHANGE MEMORY INCLUDING PHASE-CHANGE ELEMENTS IN SERIES WITH RESPECTIVE HEATER ELEMENTS AND METHODS FOR MANUFACTURING, PROGRAMMING, AND READING THEREOF

CROSS-REFERENCE TO RELATED APPLICATIONS

This application claims priority to Italian Application No. 102020000032270, filed on Dec. 23, 2020, which application is hereby incorporated herein by reference.

TECHNICAL FIELD

The present invention relates to memory, and more particularly to phase-change memory and methods for manufacturing, programming, and reading thereof.

BACKGROUND

As is known, phase-change memories use a class of materials having the property of switching between two phases having distinct electrical characteristics, associated to two different crystallographic structures of the material, and precisely a non-orderly amorphous phase and an orderly crystalline or polycrystalline phase. The two phases are thus associated to values of resistivity that differ considerably from one another, even by two or more orders of magnitude.

Currently, the elements of Group XVI of the periodic table, such as for example Te or Se, also known as chalcogenide materials or chalcogenides, may be used in phase-change memory cells. As is known, for example, from P. Zuliani, et al., "Overcoming Temperature Limitations in Phase Change Memories With Optimized $Ge_xSb_yTe_z$", IEEE Transactions on Electron Devices, Volume 60, Issue 12, pages 4020-4026, Nov. 1, 2013, it is possible to use alloys of Ge, Sb, and Te ($Ge_xSb_yTe_z$, for example $Ge_2Sb_2Te_5$) optimised by appropriately choosing the percentages of the elements that form said alloys.

The temperature at which phase transition occurs depends upon the phase-change material used. In the case of $Ge_2Sb_2Te_5$ alloy, for example, below 150° C. both the amorphous phase and the crystalline phase are stable. If the temperature is increased beyond 200° C., there is noted a fast re-arrangement of the crystals, and the material becomes crystalline. To bring the chalcogenide into the amorphous state, it is necessary to increase further the temperature up to melting point (approximately 600° C.) and then cool it rapidly.

Numerous memories are known that exploit phase-change materials as elements for storage of the two stable states (amorphous and crystalline states), which may each be associated to a respective bit at "1" or at "0". In these memories, a plurality of memory cells is arranged in rows and columns to form an array. Each memory cell is coupled to a respective selection element, which may be implemented by any switching device, such as PN diodes, bipolar junction transistors, or MOS transistors, and typically includes a chalcogenide region in contact with a resistive contact, also known as heater. A storage element is formed in a contact area between the chalcogenide region and the heater. The heater is connected to a conduction terminal of the selection element.

From an electrical standpoint, the crystallization temperature and the melting temperature are obtained by causing flow of an electric current through the resistive contact that extends in direct contact with or is functionally coupled to the chalcogenide material, thus heating it by the Joule effect.

According to the prior art, various processes of production of phase-change memory cells are known, which, however, present some disadvantages and limitations. In particular, in PCM of know type, each storage element is typically configured to store one bit only. To overcome this limitation, multilevel storage elements have been proposed, wherein one cell can be programmed according to more than two resistance values, so that a respective plurality of information can be stored in the cell. The plurality of resistance values can be achieved by using controlled writing pulses that can set intermediate resistance states between the "SET" state and the "RESET" state.

The stability of the intermediate levels of the resistance is a critical aspect due to the drift in resistance values in time and temperature.

There is thus felt the need to provide a phase-change memory (PCM) block, a phase-change memory including a plurality of PCM blocks, a method for manufacturing the PCM block and methods for programming and reading the PCM block, that meet the need identified above.

SUMMARY

In an embodiment, a phase-change memory (PCM) includes a semiconductor body housing a selection transistor; a electrical-insulation body disposed over the semiconductor body; a conductive region, extending through the electrical-insulation body, electrically coupled to the selection transistor; and a plurality of heater elements in the electrical-insulation body. Each of the plurality of heater elements includes a first end in electrical contact with a respective portion of the conductive region and a second end that extends away from the conductive region. The PCM further includes a plurality of phase-change elements extending in the electrical-insulation body and including data storage regions, where each of the data storage regions being electrically and thermally coupled to one respective heater element at the second end of the respective heater element.

In an embodiment, a method of manufacturing a phase-change memory includes forming, in a semiconductor body, a selection transistor; forming an electrical-insulation body on the semiconductor body; forming a conductive region through the electrical-insulation body, electrically coupled to the selection transistor; and forming a plurality of heater elements in the electrical-insulation body. Each of the plurality of heater elements including a first end in electrical contact with a respective portion of the conductive region and a second end that extends away from the conductive region. The method further includes forming a plurality of phase-change elements extending in the electrical-insulation body and including data-storage regions, each data-storage region being electrically and thermally coupled to one respective heater element at the second end of the respective heater element.

Another embodiment describes a method for programming a phase-change memory device, where the phase-change memory device comprises at least one row line; a plurality of column lines; and a plurality of phase-change memory cells, each of the phase-change memory cells being coupled between the row line and one respective column line. The method comprises, in a first operating condition associated with a first time interval, applying a RESET programming voltage to the plurality of phase-change memory cells, to program the plurality of phase-change memory cells to a first logic state. The method comprises, in a second operating condition associated with a second time interval that is subsequent to the first time interval, applying a SET programming voltage to selected phase-change memory cells among the plurality of phase-change memory cells, to program the selected phase-change memory cells to a second logic state, where the maximum voltage value of the RESET programming voltage is higher than that of the SET programming voltage.

An embodiment describes a method for reading a phase-change memory device, where the phase-change memory device comprises a plurality of row lines; a plurality of column lines; and a plurality of phase-change memory cells, where each of the phase-change memory cells being coupled between the row line and one respective column line. The method comprises biasing one row line to which a phase-change memory cell to be read is connected, among the plurality of row lines, to a ground reference voltage; biasing the remaining row line of the plurality of row lines to a reading voltage; biasing the plurality of column lines to the reading voltage; and acquiring, through a sense amplifier, a current flowing through the plurality of column lines to which the phase-change memory cells to be read is connected.

BRIEF DESCRIPTION OF THE DRAWINGS

For a better understanding of the present invention, preferred embodiments thereof are now described, purely by way of non-limiting example and with reference to the attached drawings, wherein:

FIG. 1C shows a PCM memory including a plurality of PCM blocks of FIG. 1B, wherein FIG. 1A illustrates a portion of a PCM memory (in the following referred to as "PCM block") in a triaxial system of mutually orthogonal axes X, Y, Z and FIG. 1B shows the PCM block of FIG. 1A in the XZ plane and FIG. 1C shows a portion of a PCM memory including a plurality of PCM blocks;

FIGS. 5A, 5B show schematically a circuit representation of a PCM memory of FIG. 1C including a plurality of PCM blocks, with an exemplary biasing scheme method for programming the PCM memory;

DETAILED DESCRIPTION OF ILLUSTRATIVE EMBODIMENTS

Embodiments of the present invention relate to a phase-change memory (PCM) block, a phase-change memory including a plurality of PCM blocks, a method for manufacturing the PCM block and methods for programming and reading the PCM block. In particular, the PCM block is of a physical multilevel type.

The PCM block 1 is manufactured by processing a substrate of a silicon wafer through front-end processing steps, in particular manufacturing steps of a CMOS process. In particular, formed in the substrate are insulation regions (not illustrated in FIG. 1A), which delimit active areas. Formed (e.g., by implants of dopant species) in the active areas are drain regions, source regions, and gate regions of respective MOS transistors 15.

The PCM block 1 further includes a plurality of contacts 11 (e.g., of tungsten) having the function of electrical contacts with the aforementioned MOS transistors 15. Each contact 11 extends with electrical continuity in the direction of the Z axis. The MOS transistors 15 are also referred to as selection transistors, operable to address, during use, memory cells of PCM block 1.

Figure 1A:
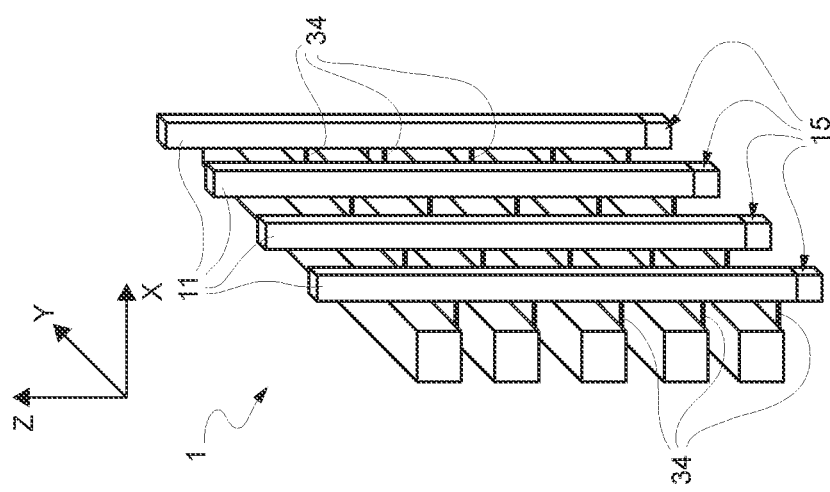
FIGS. 1A and 1B show respective views of a PCM block according to an embodiment of the present invention.

With reference to FIG. 1A, the contacts 11 extend, in one embodiment, in the form of pillars.

A plurality of phase-change material elements (in what follows, "PCM element") 50, for example a chalcogenide such as a GST (Ge—Sb—Te) compound, in particular $Ge_2Sb_2Te_5$ extend in a strip-like form along a respective direction parallel to the Y-axis; each PCM element 50 is thermally and electrically separated (or isolated) from the other PCM elements 50.

Figure 1B:
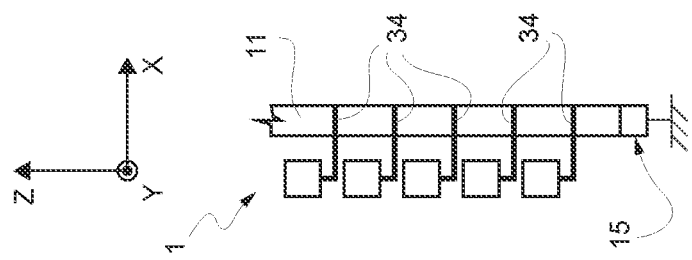

A plurality of resistive regions 34 (i.e., heaters, having the function of locally heating the PCM element 50 for triggering a selective phase-change of the heated portion) are further present. With reference to FIG. 1B, a plurality of resistive regions 34 extend laterally to each contact 11. Considering one contact 11, each resistive region 34 of such plurality of resistive regions 34 arranged laterally to the considered contact 11, has one end electrically coupled to that contact 11 and the other end electrically and thermally coupled to a portion of the PCM element 50 designed to store a logic datum (i.e., designed to undergo a phase-change of SET or RESET type). In other words, a plurality (two or more) of resistive regions 34 are electrically coupled to each contact 11. More in particular, for each contact 11, the resistive regions 34 are coupled between that contact 11 and a respective PCM element 50.

Figure 1C:
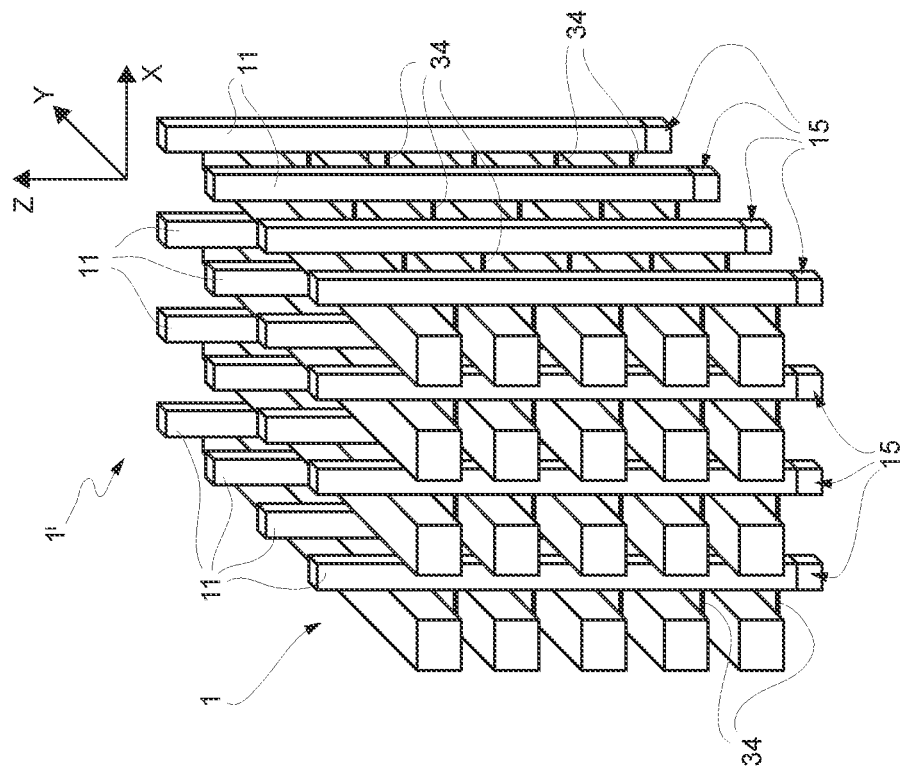
Figure 2:
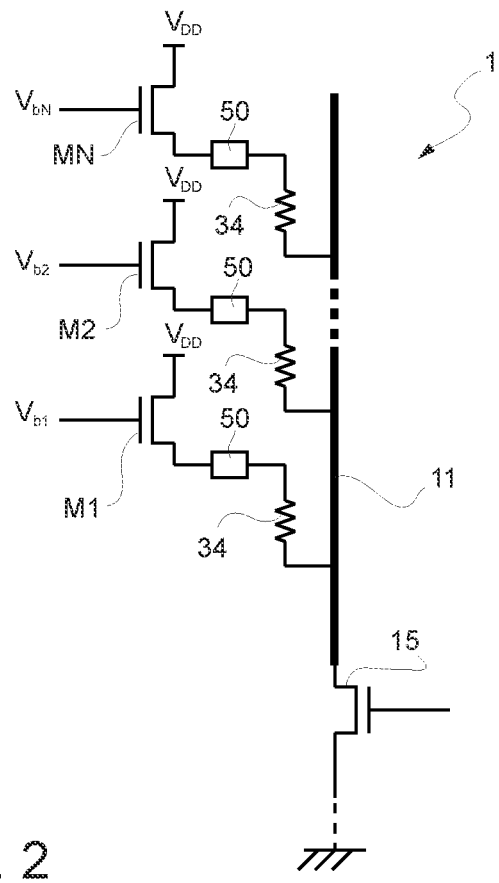
FIG. 2 is a schematic electrical representation of the PCM block of FIG. 1B.

FIG. 2 is a schematic electrical illustration of FIG. 1B (showing one column ii to which resistive regions 34 and PCM elements 50 are coupled). With further reference to FIG. 2, one end of each of the resistive regions 34 is in electrical contact with a respective portion of one contact 11; the other end of each resistive region 34 is electrically coupled to an electrical terminal of a respective control switch M1, M2, . . . , MN (switches are not shown in FIGS. 1A-1C) through a portion of the phase-change material (PCM element 50). The other electrical terminal of each control switch M1-MN is connected to a biasing voltage $V_{DD}$. (Each control switch M1-MN is, for example, a MOS transistor and the electrical terminals are source and drain terminals. The gate terminal of each control switch M1-MN can be biased by a respective control signal Vb1-VbN provided by a respective control line, to turn on/off the respective control switch M1-MN.

The portion of the PCM element 50 directly coupled to one respective resistive region 34, and such resistive region 34, form a PCM cell, which can be programmed (in logic states known as SET and RESET) and read to write and, respectively, acquire a logic datum stored in the phase-change memory element.

During a writing (programming) operation, by activating (i.e., turning on) a control switch M1, M2, ..., MN and the selector transistor 15 to which the respective contact 11 is coupled, an electrical current flows through the PCM cell, to cause the respective resistive region 34 to generate heat by Joule effect. During use, to program a SET or RESET state of the memory element, the PCM cell is biased at a writing voltage by applying a voltage $V_{DD}$ across it. The PCM element 50 is coupled to each resistive region 34 in a per se known way, to receive the heat generated through Joule effect by the resistive region 34.

The electrical resistance of the contact 11 (in the range of few Ω, or few tens of Ω) is negligible with respect to the resistance of the resistive region (heater) 34 (in the range of some kΩ, or few tens of kΩ). Accordingly, the programming voltage drops almost completely across the resistive region 34.

Figure 3:
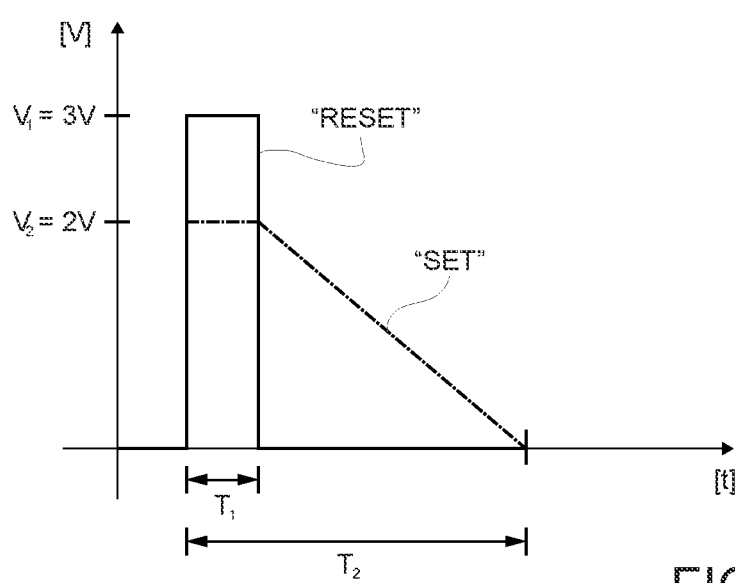
FIG. 3 shows SET and RESET pulses to be applied to a PCM cell in order to program the PCM cell in respective logic states in various embodiments.

With reference to FIG. 3, SET and RESET pulses are shown; during a time interval T1 a RESET pulse is generated, that is an electric pulse adapted to program the addressed PCM cells in the logic state "0". Similarly, during a time interval T2, a SET pulse is generated, that is an electric pulse adapted to program the addressed PCM cells in the logic state "1". The SET and RESET pulses are known to have different shapes both in terms of duration in time and in maximum voltage/current values. In particular, the RESET voltage pulse has a duration T1 lower than the duration T2 of the SET pulse; however, the maximum voltage value V1 (or corresponding current value) needed for the RESET pulse is higher than the maximum voltage value V2 (or corresponding current value) needed for the SET pulse. In the present description, the voltage value to be applied to the PCM element 50 to program the RESET state is considered to be V1=3V; the voltage value to be applied to the PCM element 50 to program the SET state is considered to be V2=2V; the voltage value to be applied to the PCM element 50 not to change the already programmed state is considered to be V3<1V (equal to 0.6V during a reading operation). It is apparent that these values are not limiting the present invention, and are used in the following disclosure for merely improving the understanding of the present invention. Of course, other voltage values can be used depending upon the specific design of the memory, the phase-change material used, etc. In general terms, provided that V1=Vreset according to the technology and design parameters, V2 is chosen equal to ⅔·Vreset and V3 is chosen lower than, or equal to, ⅓·Vreset (in any case, lower than the "RESET" threshold).

Figure 4A:
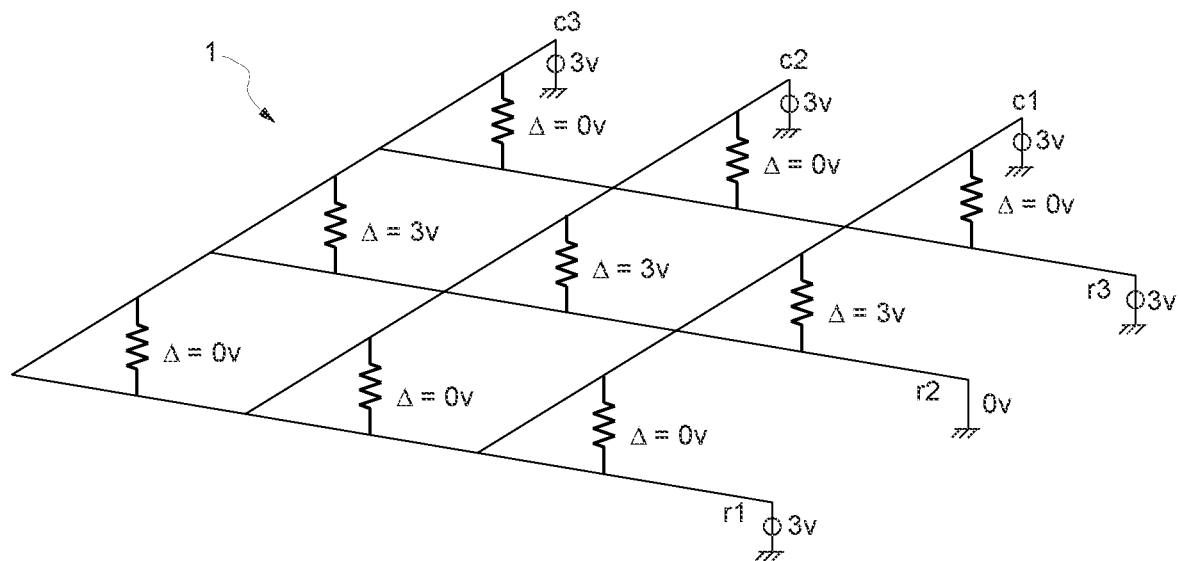
FIGS. 4A, 4B show schematically a circuit representation of one PCM block of FIG. 1A, with an exemplary biasing scheme for programming the PCM block.
Figure 4B:
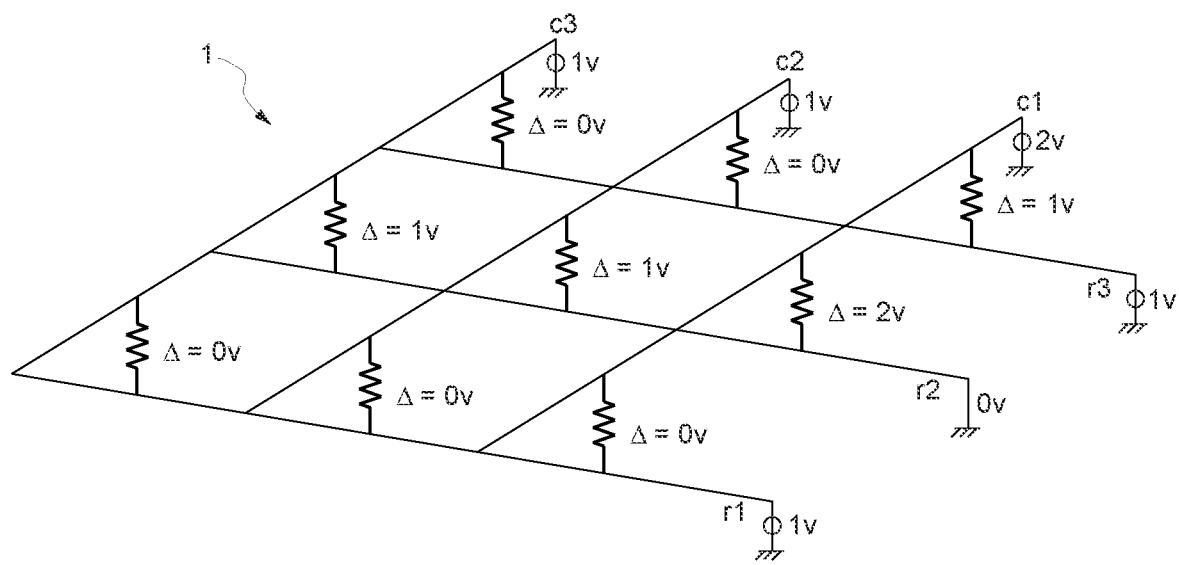
Figure 5A:
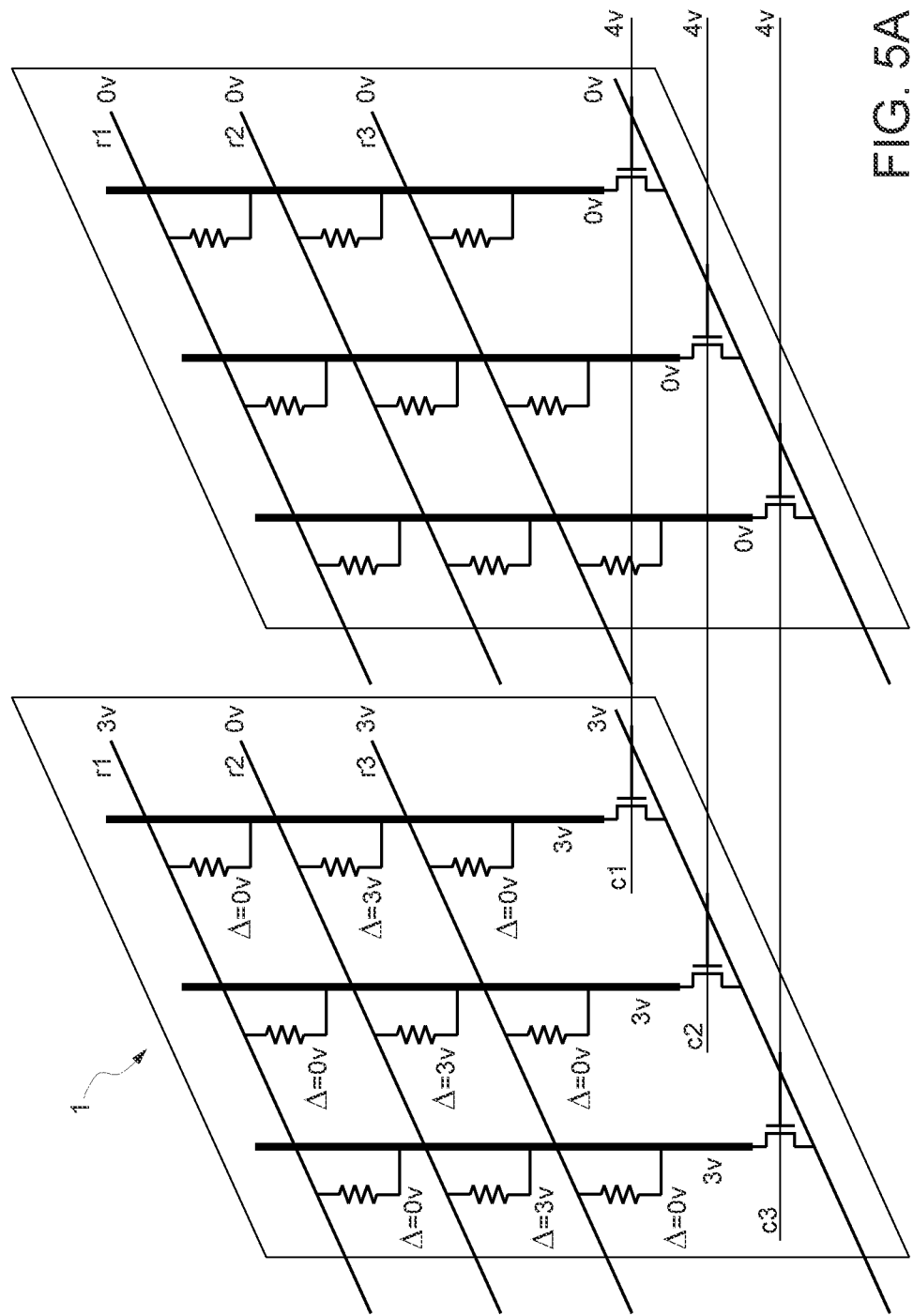

Writing or programming operations of the PCM block 1 and PCM memory 1' are described with reference to FIGS. 4A, 4B and 5A, 5B. FIGS. 4A, 4B show a simplified electrical representation of one PCM block 1 of the PCM memory 1'; FIGS. 5A, 5B show a simplified electrical representation of a plurality of PCM blocks 1.

In FIGS. 4A, 4B and 5A, 5B, each line r1-r3 corresponds to a respective stripe of PCM element 50 to be biased, and each line c1-c3 corresponds to the biasing lines used to bias the gate terminals of selection transistors 15 belonging to different PCM blocks 1 and aligned along the X-axis. For ease of representation, FIGS. 4A, 4B and 5A, 5B show only three lines r1-r3 and three lines c1-c3; it is apparent that the teaching applies to any number of lines.

PCM cells are connected between lines r1-r3 and lines c1-c3, forming a matrix. To program the PCM cells, the present invention foresees a double writing step.

FIGS. 4A and 5A show the voltage distribution during a first writing step aimed at writing (i.e., program) the PCM cells connected to the same line r2. During this operation, all the cells in the addressed line r2 are written to the "RESET" or "0" state (i.e., by applying a pulse of V1=3V across them), irrespective of whether such PCM cells are to be programmed at the RESET state or the SET state. To this end, line r2 is biased at a reference voltage of 0V (e.g., ground), while lines r1 and r3 are biased at V1=3V. In order to have the required voltage drop across the PCM cell to be programmed, all lines c1-c3 are biased at V1=3V. Therefore, only the PCM cells coupled to r2 undergoes a voltage drop of 3V, while the PCM cells coupled to r1 and r3 undergoes a voltage drop of 0V. Consequently, the PCM cell coupled between r2 and c1-c3 are all programmed at the RESET state, while the remaining PCM cells retain their current state.

In a second writing step, FIGS. 4B and 5B, carried out after the first writing step, the SET pulse is applied selectively to those PCM cells coupled to the line r2 that are to be programmed at the SET state, while maintaining unaltered the already programmed RESET state in those PCM cells that are to be programmed at the RESET state. To this end, line r2 is biased at the reference potential of 0V, while lines r1 and r3 are biased at an intermediate voltage of 1V.

It is supposed in this example that only the PCM cell coupled between r2 and c1 is to be programmed at the SET state. Therefore, line c1 is biased at V2=2V, so that the voltage drop across the PCM cell coupled between r2 and c1 is V2=2V, and the PCM cell is programmed at the SET state.

Lines c2 and c3 are biased at the intermediate voltage of 1V, so that the voltage drop across all the other PCM cells is 0V or 1V and, in any case, in a voltage range that do not alter the already programmed state of such cells. In this situation, a spurious power consumption exists, but is the limited to the size of the PCM block 1 considered.

With specific reference to FIGS. 5A and 5B, it can be appreciated that the required voltage values for the columns ii can be obtained by biasing the gate terminals of the selection transistors 15 using lines c1-c3 and use the threshold voltage drop to have the required voltage on the respective contacts 11. The gate terminals are, in this example, biased at 4V and, with a threshold supposed to be equal to 1V, one can have V1=3V on the respective contact 11. It is noted, as represented in FIGS. 5A and 5B, that the other PCB block that are not currently programmed are not stressed (all their lines are biased at 0V).

Figure 6:
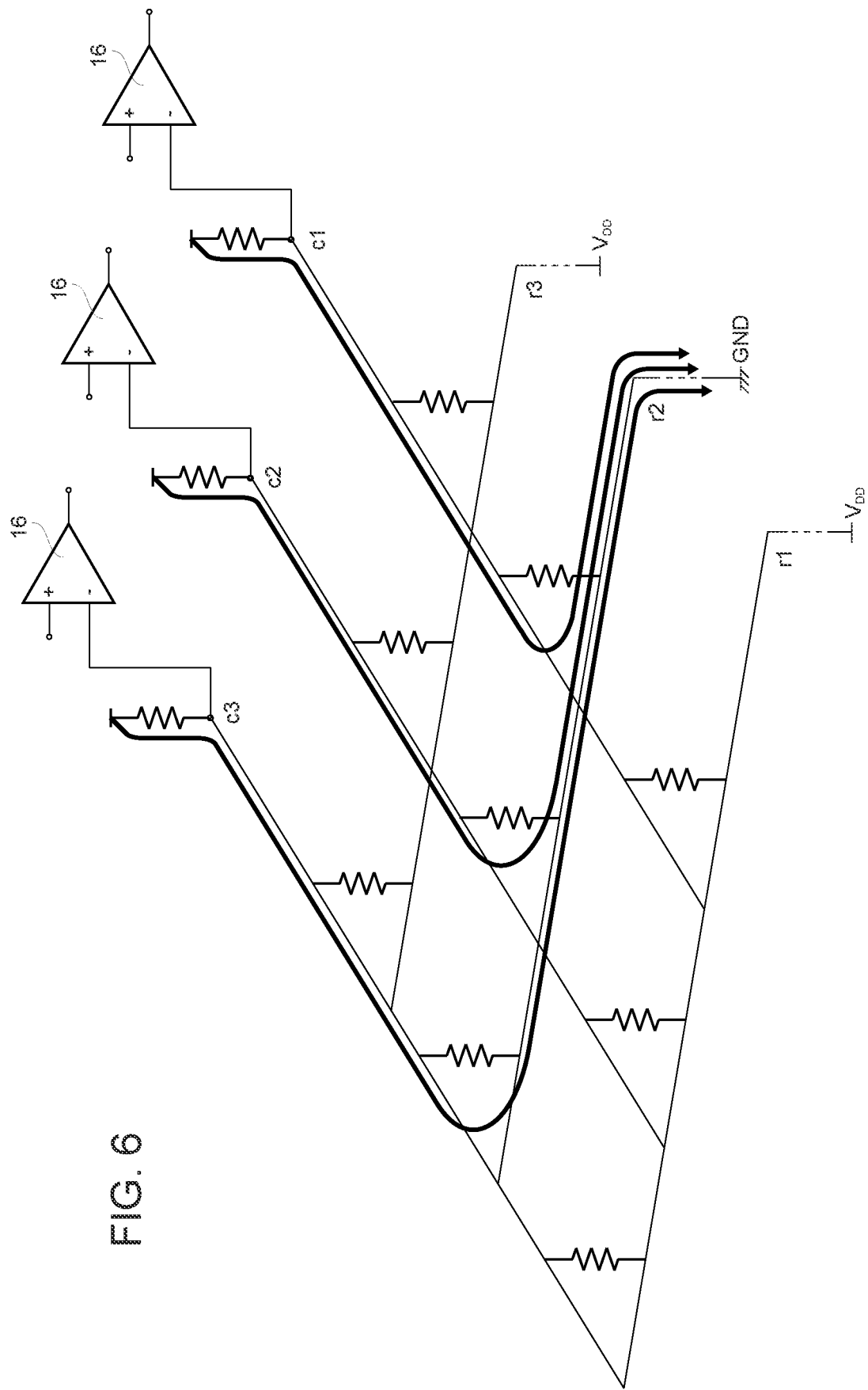
FIG. 6 shows schematically a circuit representation of one PCM block of FIG. 1A, with an exemplary biasing scheme for reading the PCM block.

FIG. 6 shows graphically a possible reading scheme, according to a schematic representation of a PCM memory having a matrix-like arrangement of rows and columns, and PCM cells coupled between such rows and columns. Only the addressed PCM cells are read, while all the others are not stressed, i.e. voltage applied to the PCM cells not to be read is zero.

Line r2, to which the PCM cells to be read are coupled, is biased at reference voltage of 0V, while all other lines r1 and r3 are biased at V3=0.6V. All lines c1-c3 are biased at V3=0.6V. Therefore, a voltage drop of V3=0.6V is applied only across the PCM cells coupled between line r2 and lines c1-c3; the remaining PCM cells are subject to a null voltage drop. It is therefore apparent that during the reading operations there is no spurious current consumption. The actual reading operation is performed through sense amplifiers 16, in a per se known way. Sense amplifiers 16 carry out reading of the data stored in the PCM cells, comparing the current that flows in the PCM cell selected (or an electrical quantity correlated thereto) with a reference current that flows in a reference cell (so-called double-ended reading) or else with a reference current supplied by a reference-current generator (so-called single-ended reading).

It is noted that each line c1-c3 and r1-r3 is connected to a respective transistor the connects/disconnects such line to/from the biasing voltage. In practice all of these transistors are not equivalent in term of size (they are designed according to the maximum voltage/current they must sustain during use). To perform the write operation, a current is needed to flow through the transistors associated to the lines r1-r3, thus implementing a write operation "by row" and allowing the corresponding transistors to sink only the current related to the single PCM cell to be written. During reading, the sense amplifiers 16 should not be connected "by row", because, as shown in FIG. 6, line r2 "sees" the total current of all PCM cells connected to it. Taking the above into account, a solution is to write "by row" and read "by column", that is to say connect the sense amplifiers 16 to the lines c1-c3 during reading operations, to read the current flowing through the line r2, which is the only line selected for reading. Since the matrix shown in FIG. 6 is symmetric, the comparators may be connected to the lines r1-r3 as well, to perform the reading operation. FIGS. 5A and 5B shown a 3D representation of the matrix; in this case, the comparators must be connected to the lines r1-r3 to perform a reading operation. In any case, it is noted that the currently known method for reading a PCM memory can be applied analogously to the PCM memory according to the present application.

With reference to FIGS. 7-11, a method for manufacturing the PCM memory 1' is disclosed, according to an embodiment of the present invention.

Figure 7:
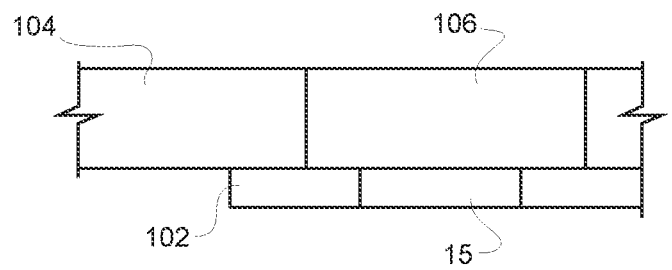
FIGS. 7-11 show subsequent method steps to manufacture a PCM block of FIG. 1A in various embodiments.

With reference to FIG. 7, a wafer 100 is provided, including a semiconductor body 102 (including a substrate and, optionally, one or more epitaxial layers on the substrate, for example of silicon). By known techniques, for example belonging to a standard CMOS process, a plurality of selection transistors 15 are formed in the semiconductor body 102. The selection transistors 15 defines active areas of semiconductor body 102. A dielectric or insulating layer 104 is formed over the semiconductor body 102, e.g. by growing or depositing silicon oxide or silicon nitride.

Through a lithographic step, trenches are formed within the dielectric layer 104, reaching and exposing the conductive terminals of the selection transistors 15. A conductive material (e.g., metal) is deposited within the trenches thus forming respective local interconnection lines, LIL, or plugs 106 that are in electrical contact with the selection transistors 15 (in particular with a conductive terminal, such as the drain terminal) of the selection transistors 15. The plugs 106 connect the selection transistors 15 to further conductive layers that will be formed above the dielectric layer 104 (such as the contacts 11).

Figure 8:
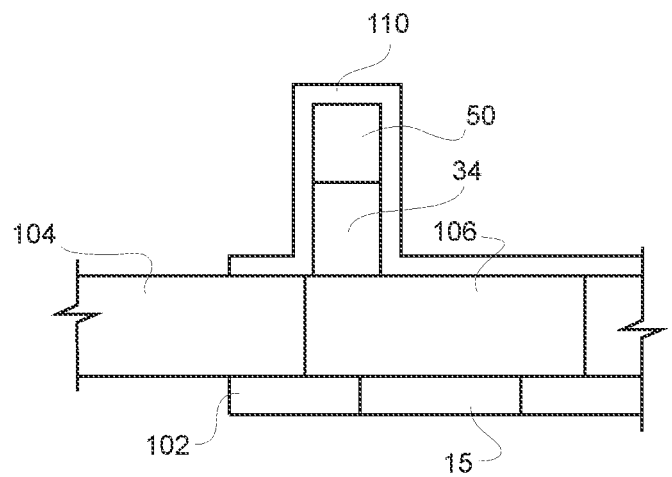

Then, FIG. 8, steps are carried out to form the resistive regions 34 (heaters) and the PCM elements 50. To this end, a step of deposition a resistive layer, for example doped titanium nitride (doped-TiN), is carried out on the dielectric layer 104 and the plugs 106. This step is followed by formation, in a per se known manner, of a layer of phase-change material, for example by depositing a chalcogenide, such as a GST (Ge—Sb—Te) compound, e.g., $Ge_2Sb_2Te_5$. Other phase-change materials may be used. Formation of the PCM layer is carried out over the resistive layer.

The resistive layer and the PCM layer thus formed are patterned, e.g. through lithography and etching, to form a stack including the resistive region 34 and the PCM element 50 previously described, having a shape and an extension according to the design of the PCM memory 1'. It is noted that the PCM element 50 is a continuous strip along Y-axis, while the resistive regions 34 extend at selective regions of the PCM element 50, i.e. at the regions of the PCM element 50 that are designed to form a memory cell. Between one resistive region 34 and another resistive region 34, along the Y-axis extension of the PCM element 50, dielectric or insulating material can be deposited.

A protective layer 110, e.g. of silicon nitride, is formed on the resistive region 34 and the PCM element 50. The protective layer 110 may also extend over the dielectric layer 104 and the portions of the plugs 106 not covered by the resistive layer 34.

Figure 9:
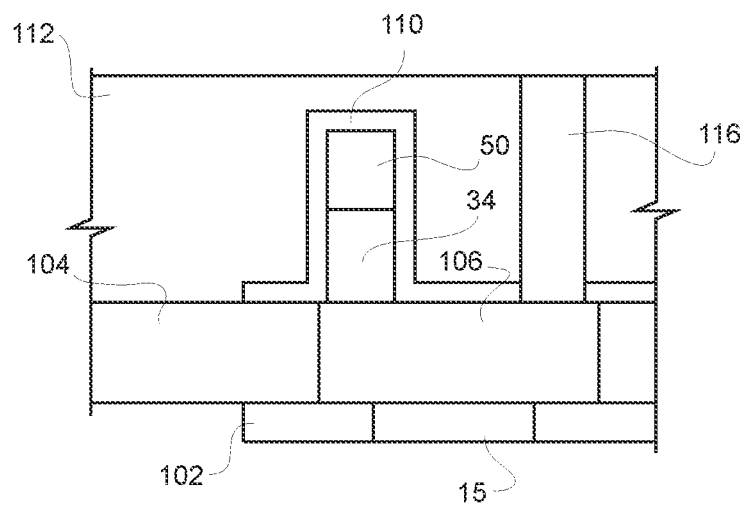

Then, FIG. 9, a further dielectric or insulating layer 112 is formed (e.g., deposited) over the resistive region 34, the PCM element 50, the protective layer 110, the dielectric layer 104 and the plugs 106. A CMP ("Chemical-Mechanical-Polishing") step on the is dielectric layer 112 carried out. Trenches are opened through the dielectric layer 112 and the protective layer 110, reaching a region of the plugs 106 lateral to the stack formed by the resistive region 34 and the PM layer 50. The trenches are then filled with conductive material, in particular metal, more in particular tungsten. Plugs 116 extending entirely through the dielectric layer 112, in electrical contact with respective plugs 106 are thus formed.

Figure 10:
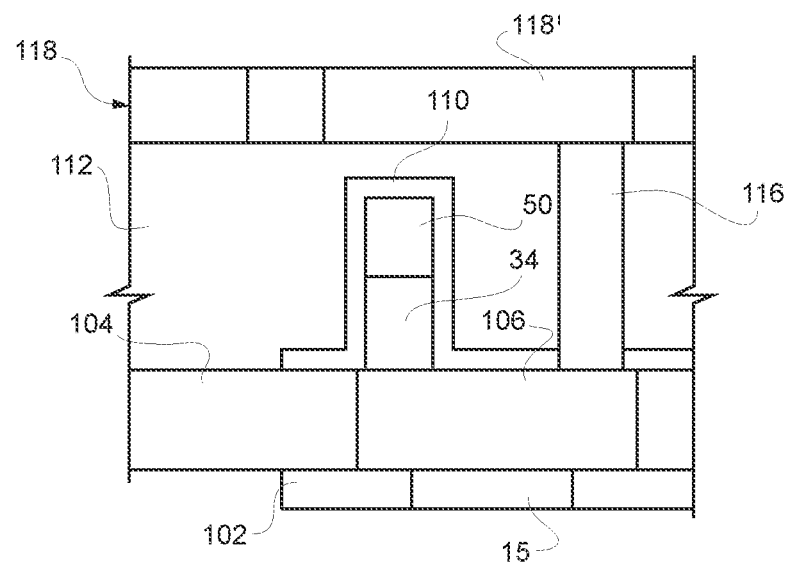

Then, FIG. 10, a step is carried out to deposit and pattern a metal layer 118 over the dielectric layer 112. The metal layer 118 is patterned in such a way to define a plurality of local interconnections 118', each of them being electrically connected to one respective plug 116.

Figure 11:
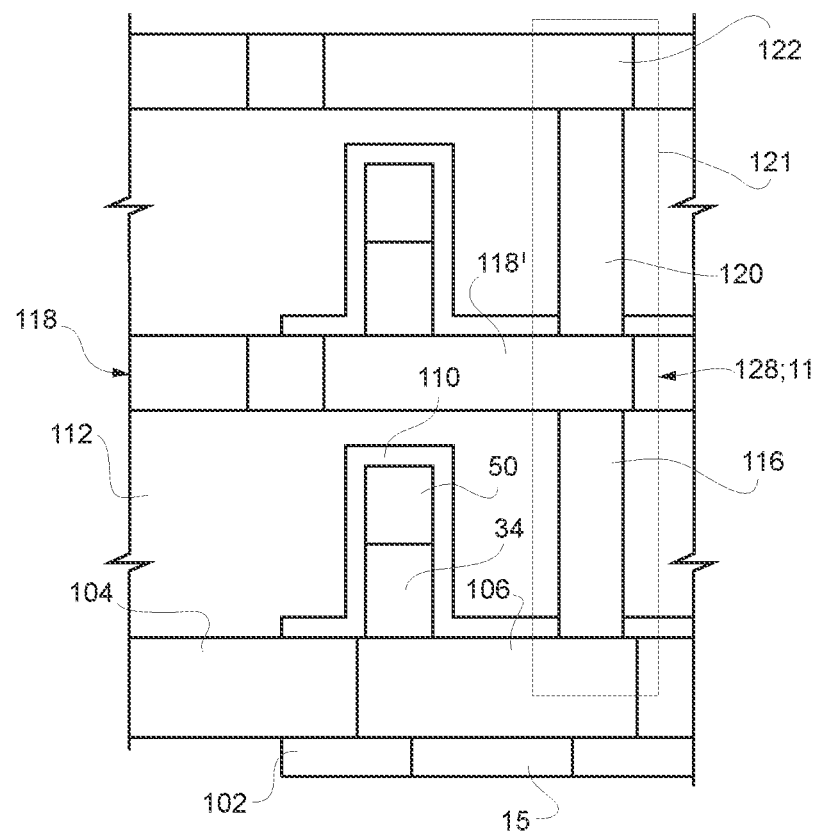

The structure of FIG. 10 (with the exception of the formation of transistors 15 and plugs 106) is then replicated, as shown in FIG. 11.

With reference to FIG. 11, the steps previously described are repeated in order to form further stacks of resistive regions 34 and PCM elements 50 and further plugs 120 (analogous to plugs 116 previously described) above the local interconnections 118' and in electrical contact with respective local interconnections 118'. A dielectric or insulating layer 121 is formed analogously to the dielectric layer 112 and further metal interconnections 122 (analogous to metal interconnections 118') are formed on the dielectric layer 121.

In particular, the stack identified with reference numeral 128 in FIG. 11, including the plug 106 extending in electrical contact with one selection transistor 15, the plug 116 extending in electrical contact with such plug 106, the metal interconnection 118' extending in electrical contact with such plug 116, the further plug 120 and the further metal interconnection 122 extending in electrical contact with such further plug 120 form (at least in part) one contact 11 previously described. A plurality over PCM elements 50, each one including the respective heaters 34, extend one above the other along the Z-axis and are electrically connected to the same stack 128 (contact 11), as in the embodiments of FIGS. 1A-1C.

The steps of FIG. 11 can be replicated as many time as desired, according to the design of the PCM memory 1'.

Figure 12:
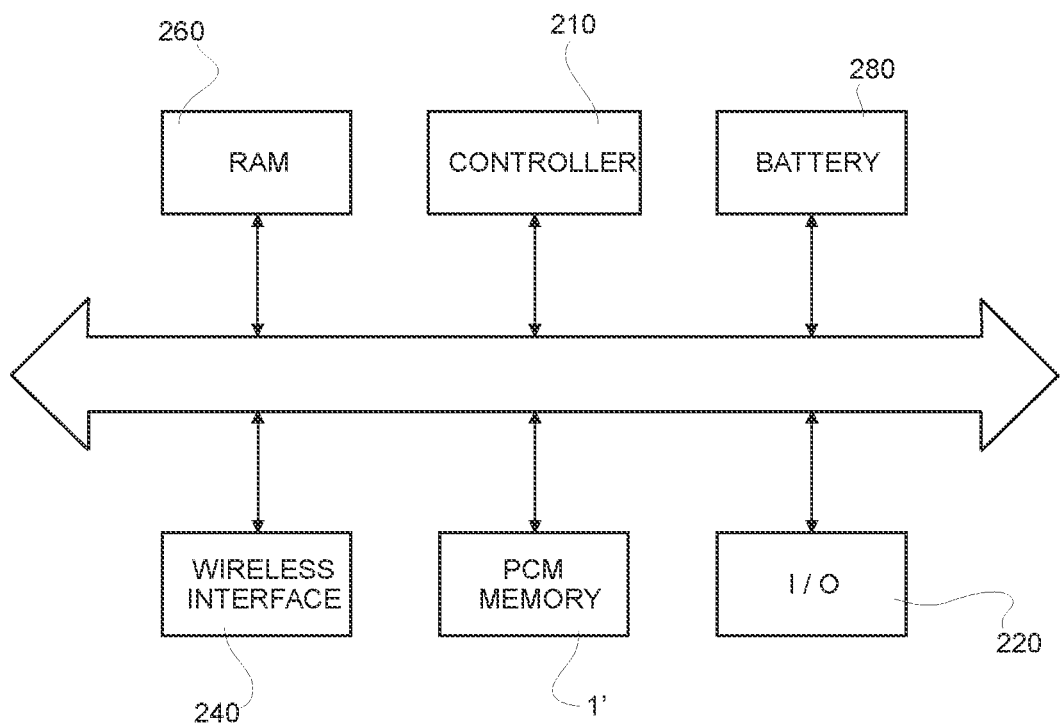
FIG. 12 schematically shows an embodiment system that includes one or more PCM blocks of FIG. 1A or 1B, or a PCM memory of FIG. 1C.

FIG. 12 illustrates a portion of a system 200 that may be implemented in various devices, such as for example PDAs, portable computers, phones, photographic cameras, video cameras, etc. The system 200 may include one or more among a controller 210 (e.g., a microprocessor), an input/output device 220, for example a keypad and a display, a chip housing in an integrated form the PCM memory 1', a wireless interface 240, and a random-access memory (RAM) 260, connected together by a bus system 250.

According to one embodiment, the system 200 may be supplied by a battery 280, or alternatively by a mains supply source. It is clear that the scope of the present disclosure is not limited to embodiments comprising all the components of FIG. 12. For example, one or more from among the random-access memory (RAM) 260, the wireless interface 240, the battery 280, and the input/output device 220 may be omitted.

The advantages of the present disclosure emerge clearly from the foregoing description.

For example, the area/bit of a PCM memory according to the present invention is considerably reduced with respect to known PCM memories. The increase of the level also increases the area gain depending of the number of the cells stacked.

Finally, it is clear that modifications and variations may be made to what has been described and illustrated herein, without thereby departing from the scope of the present invention, as defined in the annexed claims.

Figure 13:
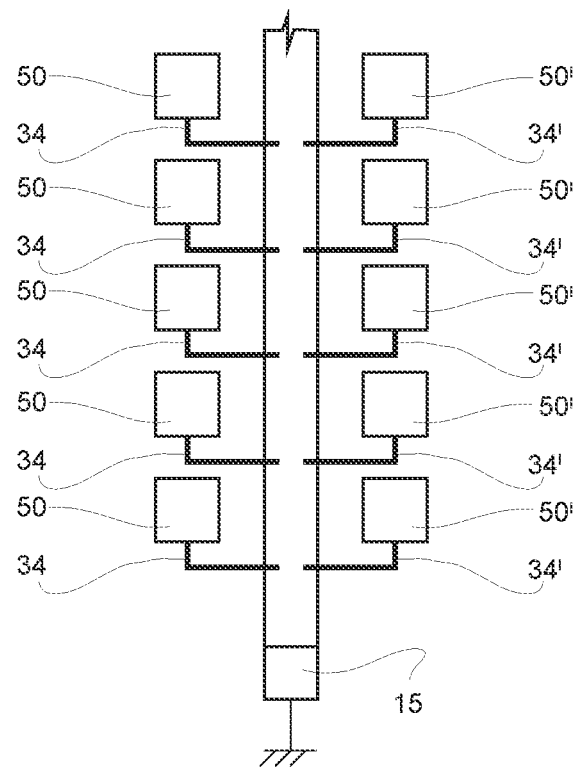
FIG. 13 is a further embodiment of a PCM block.

For example, FIG. 13 shown a PCM block 300 according to a further embodiment of the present invention. Elements of the PCM block 300 common to the PCM block 1 of FIG. 1B are identified with the same reference numerals. As shown in FIG. 13, further resistive regions (heaters) 34' extend away from the contact 11 at a side of the contact 11 opposite to the side facing the resistive regions 34. Resistive regions 34' have characteristics analogous to the resistive regions 34, and are manufactured accordingly during the same process steps, in a way that is per se apparent to the skilled person. PCM elements 50 are electrically and thermally coupled to the resistive regions 34', analogously to PCM elements 50. The functioning of the PCM block 300 is the same as that of PCM block 1 and is therefore not further described.

What is claimed is:

1. A phase-change memory (PCM) comprising:
   a semiconductor body housing a selection transistor;
   an electrical-insulation body disposed over the semiconductor body;
   a conductive region, extending through the electrical-insulation body, electrically coupled to the selection transistor;
   a plurality of heaters in the electrical-insulation body, each of the plurality of heaters including a first end in electrical contact with a respective portion of the conductive region and a second end that extends away from the conductive region;
   a plurality of phase-change material features extending in the electrical-insulation body and including data storage regions, each of the data storage regions being electrically and thermally coupled to one respective heater at the second end of the respective heater, wherein each of the plurality of phase-change material features is a continuous strip along a direction parallel to a major surface of the semiconductor body, and wherein a subset of the plurality of heaters is disposed at different locations along each of the continuous strip and separated by insulating regions; and
   a sealing layer of dielectric or insulating material covering sidewalls of a stack comprising one of the heaters and the respective one of the data storage regions coupled to it, the sealing layer capping a top major surface of the respective one of the data storage regions, wherein a portion of the electrical-insulation body covers the sealing layer above the stack.

2. The PCM according to claim 1, wherein the electrical-insulation body includes a plurality of electrical-insulation layers, each heater and the associated data storage region extending in a respective one of the electrical-insulation layers.

3. The PCM according to claim 2, wherein the conductive region includes a plurality of electrically interconnected plugs, each plug extending in a respective one of the electrical-insulation layers.

4. The PCM according to claim 3, wherein the plurality of electrical-insulation layers includes one or more stacks of overlying electrical-insulation layers, each stack including a respective first electrical-insulation layer on a respective second electrical-insulation layer,
   and wherein for each stack a respective interconnection conductive line extends between the first and second electrical-insulation layers,
   the interconnection conductive line being electrically connected to the plug extending in the first electrical-insulation layer and to the plug extending in the second electrical-insulation layer thus forming a conductive path between the first and the second electrical-insulation layers.

5. The PCM according to claim 4, wherein the interconnection conductive line is further electrically connected to the heater extending in the first electrical-insulation layer.

6. The PCM according to claim 1, wherein the heaters are aligned to one another along a vertical direction orthogonal to a major surface of the semiconductor body.

7. The PCM according to claim 1, wherein the conductive region has a main extension along a first direction orthogonal to a major surface of the semiconductor body, each heater being arranged laterally to the conductive region.

8. The PCM according to claim 1, further comprising a plurality of switching transistors, each one having an own first conduction terminal coupled to one respective phase-change material feature, an own second conduction terminal coupled to a bias potential and an own control terminal,
   wherein the selection transistor includes an own first conduction terminal coupled to the conductive region, an own second conduction terminal coupled to a reference-potential, and an own control terminal,
   the control terminals of the selection transistor and of the switching transistors being operable to selectively connect one respective heater and the associated phase-change material feature between the reference-potential and the bias potential.

9. The PCM according to claim 1, wherein the PCM is integrated into a chip comprising a biasing circuitry, the bias circuitry comprising:
   a programming stage including voltage generators configured to cause a SET or RESET programming current to flow through selected heaters to generate heath by Joule effect, so as to cause a controlled phase-transition of the associated data storage region of the phase-change material feature; and
   a reading stage including a plurality of sense amplifiers, each coupled to one respective data-storage region to read a current flowing through the respective data-storage region during a read operation of a block of the PCM.

10. A method of manufacturing a phase-change memory, the method comprising:
   forming, in a semiconductor body, a selection transistor;
   forming an electrical-insulation body on the semiconductor body;
   forming a conductive region through the electrical-insulation body, electrically coupled to the selection transistor;

forming a plurality of heaters in the electrical-insulation body, each heater including a first end in electrical contact with a respective portion of the conductive region and a second end that extends away from the conductive region;

forming a plurality of phase-change material features extending in the electrical-insulation body and including data-storage regions, each data-storage region being electrically and thermally coupled to one respective heater at the second end of the respective heater, wherein each of the plurality of phase-change material features is a continuous strip along a direction parallel to a major surface of the semiconductor body, and wherein a subset of the plurality of heaters is disposed at different locations along each of the continuous strip and separated by insulating regions; and forming a sealing layer of dielectric or insulating material covering sidewalls of a stack comprising one of the heaters and the respective one of the data storage regions coupled to it, the sealing layer capping a top major surface of the respective one of the data storage regions, wherein a portion of the electrical-insulation body covers the sealing layer above the stack.

11. The method according to claim 10, wherein forming the electrical-insulation body includes forming a plurality of electrical-insulation layers, and wherein forming the heaters and the data-storage region includes burying each heater and the associated data storage region in a respective one of the electrical-insulation layers.

12. The method according to claim 11, wherein forming the conductive region includes forming a plug in a respective one of the electrical-insulation layers and electrically connecting each of the plugs to one another.

13. The method according to claim 12, wherein forming the plurality of electrical-insulation layers includes forming one or more stacks of overlying electrical-insulation layers, each stack including a respective first electrical-insulation layer on a respective second electrical-insulation layer, the method further comprising forming, for each stack, a respective interconnection conductive line between the first and second electrical-insulation layers, the interconnection conductive line being formed in electrical connection with the plug extending in the first electrical-insulation layer and with the plug extending in the second electrical-insulation layer thus forming a conductive path between the first and the second electrical-insulation layers.

14. The method according to claim 13, wherein the interconnection conductive line is further electrically connected to the heater extending in the first electrical-insulation layer.

15. The method according to claim 10, wherein the heaters are formed aligned to one another along a vertical direction orthogonal to a major surface of the semiconductor body.

16. The method according to claim 10, wherein the conductive region is formed with a main extension along a first direction orthogonal to a major surface of the semiconductor body, each heater being formed laterally to the conductive region.

17. A phase-change memory (PCM) comprising:
a semiconductor body comprising a 2-D array of selection transistors;
a 3-D memory array disposed over the semiconductor body;
each of the 2-D array of selection transistors being coupled to a 1-D vertical array of the 3-D memory array to form a multilevel memory cell;
a row of the multilevel memory cells along a first direction parallel to a major surface of the semiconductor body, the row of the multilevel memory cells comprising:
stacked layers of electrically electrical-insulation bodies disposed over each other;
stacked rows of conductive regions electrically coupled to one of the selection transistors from the respective row of the multilevel memory cell, each row of the conductive regions arranged along the first direction;
stacked rows of heaters, each of the heaters including a first end in electrical contact with a respective conductive region and a second end that extends away from the conductive region, each row of the heaters arranged along the first direction;
a stack of continuous strips of a phase change material, each of the continuous strips being disposed along the first direction, each of the continuous strips comprising data storage regions, each of the data storage regions being electrically and thermally coupled to one of the heaters at the second end of the respective heater, and wherein the heaters associated with the data storage regions are disposed at different locations along each of the continuous strip and separated by insulating regions; and
a plurality of sealing layers of insulating material covering sidewalls of a stack comprising one of the heaters and the respective one of the data storage regions coupled to it, each of the sealing layers capping a top major surface of the respective one of the data storage regions, wherein a portion of one of the electrical-insulation bodies separates the stack with the respective sealing layer from one of the conductive regions above.

18. The PCM according to claim 17, wherein the heaters within the 1-D vertical array are aligned to one another along a vertical direction orthogonal to the first direction.

19. The PCM according to claim 18, wherein the conductive regions within the 1-D vertical array are aligned to one another along the vertical direction.

* * * * *